(12) United States Patent
Salinas et al.

(10) Patent No.: US 7,427,728 B2
(45) Date of Patent: Sep. 23, 2008

(54) ZONE CONTROL HEATER PLATE FOR TRACK LITHOGRAPHY SYSTEMS

(75) Inventors: Martin Jeff Salinas, San Jose, CA (US); David H. Quach, San Jose, CA (US)

(73) Assignee: Sokudo Co., Ltd., Kyoto (JP)

( * ) Notice: Subject to any disclaimer, the term of this patent is extended or adjusted under 35 U.S.C. 154(b) by 40 days.

(21) Appl. No.: 11/483,832

(22) Filed: Jul. 7, 2006

(65) Prior Publication Data

US 2008/0006619 A1    Jan. 10, 2008

(51) Int. Cl.
*H05B 3/68* (2006.01)

(52) U.S. Cl. .................. 219/446.1; 219/443.1

(58) Field of Classification Search .............. 219/473.1, 219/468.2; 118/724, 725; 392/416, 418–425; 174/250–262

See application file for complete search history.

(56) References Cited

U.S. PATENT DOCUMENTS

| | | | |
|---|---|---|---|
| 5,817,156 A | 10/1998 | Tateyama et al. | |
| 6,082,297 A * | 7/2000 | Pollock et al. | 118/725 |
| 6,222,161 B1 | 4/2001 | Shirakawa et al. | |
| 6,229,116 B1 | 5/2001 | Shirakawa et al. | |
| 6,384,383 B2 * | 5/2002 | Kano et al. | 219/444.1 |
| 6,450,803 B2 | 9/2002 | Shirakawa et al. | |
| 6,669,784 B2 * | 12/2003 | Futamura et al. | 118/729 |
| 6,676,416 B1 | 1/2004 | Ellis et al. | |
| 6,753,508 B2 | 6/2004 | Shirakawa | |
| 6,951,998 B2 | 10/2005 | Nanno et al. | |
| 7,189,946 B2 * | 3/2007 | Goto et al. | 219/444.1 |
| 7,244,912 B1 * | 7/2007 | Rawlings | 219/219 |
| 7,279,661 B2 * | 10/2007 | Okajima et al. | 219/444.1 |
| 2002/0132052 A1 | 9/2002 | Kumar et al. | |
| 2004/0048220 A1 | 3/2004 | Nguyen et al. | |
| 2004/0099958 A1 | 5/2004 | Schildgen et al. | |
| 2004/0155026 A1 | 8/2004 | Mandal | |
| 2005/0176272 A1 | 8/2005 | Rosenau | |

OTHER PUBLICATIONS

International Search Report and Written Opinion of PCT Application No. PCT/US07/72543, dated Feb. 25, 2008, 8 pages total.

* cited by examiner

*Primary Examiner*—Sang Y. Paik
(74) *Attorney, Agent, or Firm*—Townsend and Townsend and Crew LLP

(57) ABSTRACT

A substrate heater comprising a bake plate having an upper surface, a lower surface and a peripheral side surface extending between the upper and lower surfaces, the bake plate including at least one heating element, at least one temperature sensor and a plurality of wires including at least one wire coupled to the heating element and at least one wire coupled to the temperature sensor; a shield spaced apart from and generally surrounding the lower and peripheral side surfaces of the bake plate, the shield having an interior upper surface facing the lower surface of the bake plate, an interior side surface facing the peripheral side surface of the bake plate and a lower surface opposite the interior upper surface; a patterned signal layer formed on the lower surface of the shield, wherein the plurality of wires are electrically coupled to a corresponding plurality of signal traces formed in the patterned signal layer; and a connector, electrically coupled to the plurality of signal traces in the patterned signal layer, adapted to facilitate electrical connections to the plurality of wires.

9 Claims, 4 Drawing Sheets

ZONE CONTROL HEATER PLATE FOR TRACK LITHOGRAPHY SYSTEMS

BACKGROUND OF THE INVENTION

The present invention relates generally to the field of substrate processing equipment. More particularly, the present invention relates to a method and apparatus for controlling the temperature of substrates, such as semiconductor substrates, used in the formation of integrated circuits.

Modern integrated circuits (ICs) contain millions of individual elements that are formed by patterning the materials, such as silicon, metal and/or dielectric layers, that make up the integrated circuit to sizes that are small fractions of a micrometer. A number of steps associated with the fabrication of integrated circuits include heating the semiconductor substrate upon which the ICs are formed. One example of a heating step includes curing a photoresist film prior to a photolithography process. A photoresist film can be cured, for example, by placing a semiconductor substrate having an uncured photoresist film formed thereon on a bake plate and heating the plate to a sufficiently high temperature for a predetermined period of time.

Over the years there has been a strong push within the semiconductor industry to shrink the size of semiconductor devices. The reduced feature sizes have caused the industry's tolerance to process variability to shrink, which in turn, has resulted in semiconductor manufacturing specifications having more stringent requirements for process uniformity and repeatability. One manifestation of these more stringent requirements is the desirability to precisely control the temperature of a semiconductor substrate in a bake plate heating operation such as the photoresist curing operation just described.

To this end, the industry has developed heater plates that include multiple heater elements arranged in different zones. Such an arrangement allowed one zone of the heater plate to be heated at a slightly higher temperature than other zones to compensate for temperature nonuniformities that may occur between different points on the semiconductor substrate. FIG. 1 is a top plan view of an example of a previously known bake plate that includes six different electrically independently heating zones. As shown in FIG. 1, bake plate 10 includes six independent heater zones $12_1$-$12_6$ along with a corresponding number of temperature sensors $14_1$-$14_6$, one for each of the heater zones $12_1$-$12_6$.

Depending on the type of temperature sensor used, each sensor and independent heater zone requires at least three separate wires and often five or more separate wires (e.g., a five wire arrangement may use two wires for AC power connections to the heater element and three wires for connections to the sensor). Between the multiple zones used in many zone heater bake plates and the fact that each zone often includes its own temperature sensor having multiple dedicated wires, it can be appreciated that a zone heater may readily have twenty, thirty or even more wires extending from it. Effectively and efficiently managing such a large number of wires presents challenges.

BRIEF SUMMARY OF THE INVENTION

According to the present invention, methods and apparatus related to substrate processing are provided. More particularly, embodiments of the present invention pertain to a method and apparatus for heating a substrate in a highly controllable manner and provide an effective and efficient solution for managing the large number of wires that may be required to effect such highly controlled heating. While embodiments of the invention may prove to be particularly useful in heating station of a track lithography tool, other embodiments of the invention can be used in other applications where it is desirable to heat substrates in a highly controllable manner.

According to one embodiment a substrate heater comprising a bake plate, a shield, a patterned signal layer formed on a lower surface of the shield and a connector, electrically coupled to the plurality of signal traces in the patterned signal layer, adapted to facilitate electrical connections to the plurality of wires is disclosed. The bake plate has an upper surface, a lower surface and a peripheral side surface extending between the upper and lower surfaces and includes at least one heating element and at least one temperature sensor. A plurality of wires including at least one wire coupled to the heating element and at least one wire coupled to the temperature sensor are attached to the bake plate and electrically coupled to a corresponding plurality of signal traces formed in the patterned signal layer. The shield is spaced apart from and generally surrounds the lower and peripheral side surfaces of the bake plate. The shield has an interior upper surface facing the lower surface of the bake plate, an interior side surface facing the peripheral side surface of the bake plate and a lower surface opposite the interior upper surface.

In another embodiment a substrate heater comprises a bake plate having an upper surface, a lower surface and a peripheral side surface extending between the upper and lower surfaces, the bake plate including at least one heating element, at least one temperature sensor and a plurality of wires including at least one wire coupled to the heating element and at least one wire coupled to the temperature sensor; a patterned signal layer formed on the lower surface of the bake plate, wherein the plurality of wires are electrically coupled to a corresponding plurality of signal traces formed in the patterned signal layer; and a connector, electrically coupled to the plurality of signal traces in the patterned signal layer, adapted to facilitate electrical connections to the plurality of wires.

In still another embodiment a substrate heater comprises a bake plate having an upper surface, a lower surface and a peripheral side surface extending between the upper and lower surfaces, the bake plate including a plurality of independently controllable heating zones, each zone including a heating element, a temperature sensor and a plurality of wires including at least one wire coupled to the heating element and at least one wire coupled to the temperature sensor; a shield spaced apart from and generally surrounding the lower and peripheral side surfaces of the bake plate, the shield having an interior upper surface facing the lower surface of the bake plate, an interior side surface facing the peripheral side surface of the bake plate and a lower surface opposite the interior upper surface; a patterned signal layer formed on the lower of the shield, wherein the plurality of wires associated with each independently controllable heating zone are electrically coupled to a corresponding plurality of signal traces formed in the patterned signal layer; and a connector, electrically coupled to the plurality of signal traces in the patterned signal layer, adapted to facilitate electrical connections to the plurality of wires.

Various benefits and advantages that can be achieved by use of the present invention will be described in detail throughout the present specification and more particularly below in conjunction with the following drawings.

DETAILED DESCRIPTION OF THE INVENTION

The present invention generally provides a method and apparatus for heating substrates in a highly controllable manner. While it is to be recognized that embodiments of the invention are particularly useful for heating substrates according a particular thermal recipe within a track lithography tool, other embodiments of the invention can be used in other applications where it is desirable to heat substrates in a highly controllable manner. Note the terms "substrate" and "wafer" are sometimes used herein interchangeably and are sometimes specifically used in reference to a semiconductor wafer upon which integrated circuits are formed. A person of skill in the art will recognize the present invention is not limited to processing semiconductor wafers and can be used to process any substrate for which a highly controlled thermal treatment is desirable.

Figure 2:
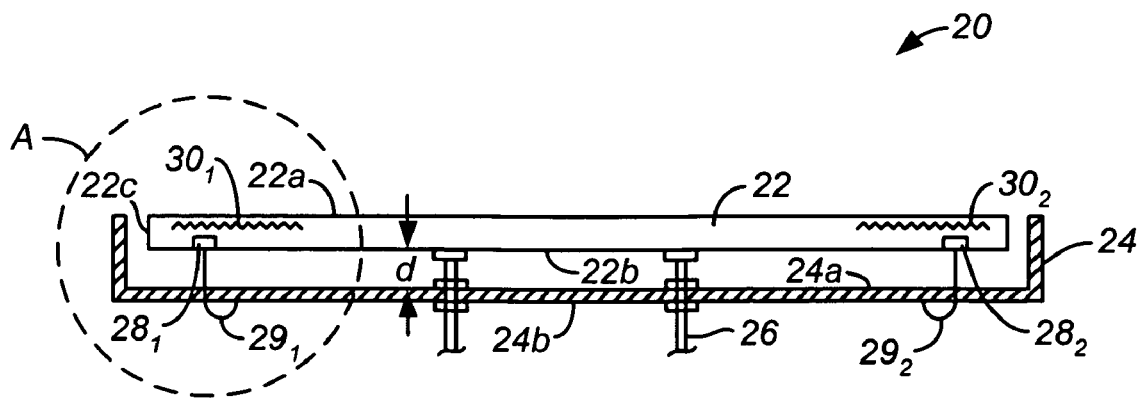
FIG. 2 is a simplified cross-section of a substrate heater according to an embodiment of the present invention.

Reference is now made to FIG. 2, which is a simplified cross-sectional view of a substrate heater 20 according to an embodiment of the present invention. Substrate heater plate 20 includes a bake plate 22 and a heat shield 24. Bake plate 22 includes an upper substrate receiving surface 22a upon which a substrate is placed during a heat treatment step and a lower surface 22b. Bake plate 22 can be, for example, an aluminum plate having a continuous upper surface with restive heater elements bonded to its backside.

Figure 5:
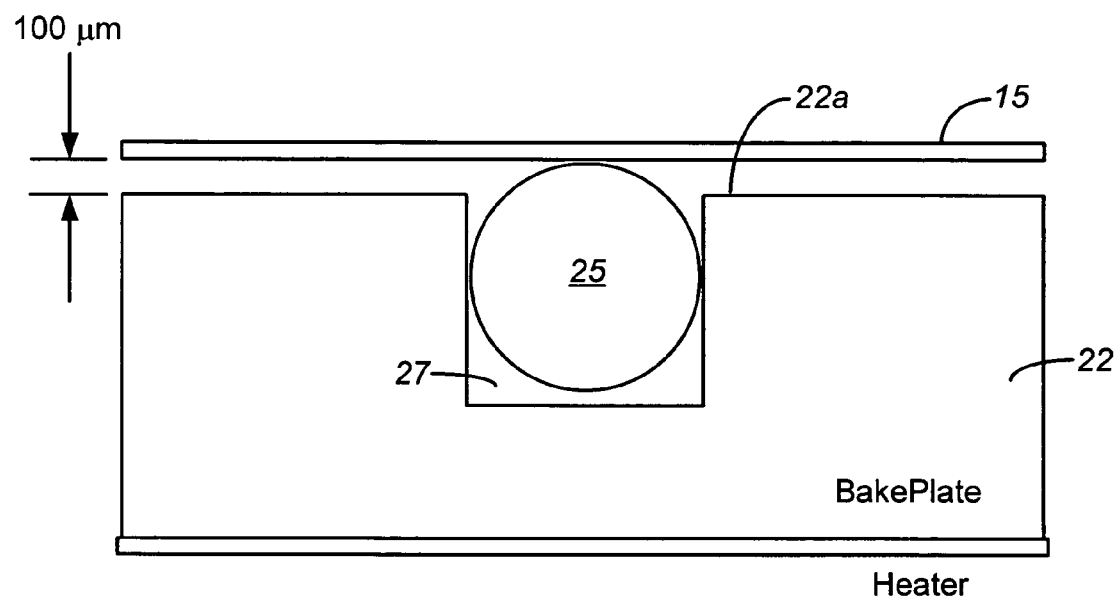
FIG. 5 is a simplified cross-sectional view of a portion of a bake plate 22 including a proximity pin 25 that can be used to space a wafer above the surface of the bake plate according to some embodiments of the invention.

In some embodiments, a plurality of proximity pins distributed across upper substrate receiving surface 22a can be used to support a substrate in close proximity to upper surface 22a during heat treatment. An example of a proximity pin 25 is shown in FIG. 5. As shown in FIG. 5, proximity pin 25 may be, for example, a sapphire ball placed in a trench 27 formed on upper surface 22a of bake plate 22. When a wafer 15 is placed over the bake plate onto proximity pin 25, pin 25 spaces the wafer a predetermined distance (e.g., 100 μm) above surface 22a. Details of proximity pins appropriate for this purpose are set forth in U.S. application Ser. No. 11/111, 155, entitled "Purged Vacuum Chuck with Proximity Pins" filed on Apr. 20, 2005, which is hereby incorporated by reference for all purposes.

Figure 1:
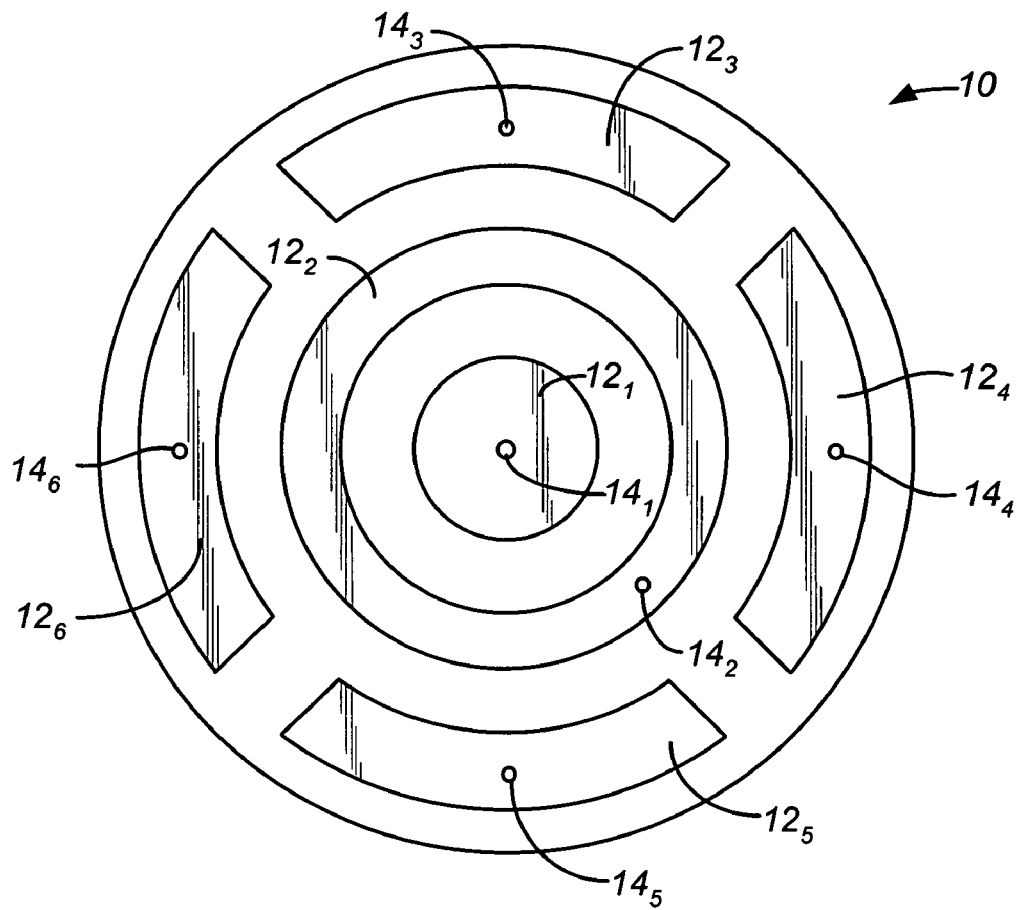
FIG. 1 is a simplified representative view of a previously known zone heater bake plate.

Referring back to FIG. 2, lower surface 22b is spaced apart from an upper surface 24a of the heat shield by a predetermined distance, d. In one embodiment distance d is, for example, between 2 to 10 mm. A side peripheral surface 22c extends between upper surface 22a and lower surface 22b. Several support pins 26 (two of which are shown in FIG. 2) protrude from lower surface 22b extending through heat shield 24 to support both bake plate 22 and heat shield 24. Because the contact area between support pins 26 and bake plate 22 is minimized, thermal loss to the support pins is also minimized. In embodiments where substrate heater 20 is moveable along a z-axis, support pins 26 are operatively coupled to an appropriate lift or motor. In other embodiments, support pins 26 may be coupled to a support base or similar element. In one particular embodiment, three symmetrically placed support pins 26 are used to support bake plate 22, and the three pins all extend from a centered, inner-most heating zone, such as zone 12 shown in FIG. 1. In such an arrangement, the inner-most zone can be controlled to heat the bake plate at a slightly elevated temperature to compensate for heat loss through the support pins.

Two temperature sensors $28_1$ and $28_2$ (e.g., resistance temperature detectors—"RTDs") that are operatively coupled to measure temperature within two independently controllable heating zones $30_1$ and $30_2$, respectively, are shown in FIG. 2. Each temperature sensor $28_1$ and $28_2$ is electrically coupled to a respective wire bundle $29_1$ and $29_2$, each of which typically includes between 3-8 separate wires. Wire bundles $29_1$ and $29_2$ extend through a pass-through opening in heat shield 24 and are coupled to a signal layer formed on a lower surface of the heat shield as described more fully with respect to FIG. 3.

Bake plate 22 may be, for example, a high performance, multi-zone bake plate that can be used for post-exposure bake of photoresist material in a track lithography tool. Thus, bake plate 22 may provide tight control over both spatial and temporal wafer temperature profile as well as the flexibility to induce a deliberate temperature non-uniformity in one area or zone of the bake plate to compensate for variations in wafer temperature, such as those due to wafer warp or other process variations in the wafer flow. Towards this end, it is to be understood that other independently controllable heating zones $30_1$ not shown in FIG. 2 may exist along with other temperature sensors $28_1$ and wire bundles $29_1$. Also, in one embodiment there is at least one proximity pin within each of the independently controlled heater zones $30_1$.

Figure 3:
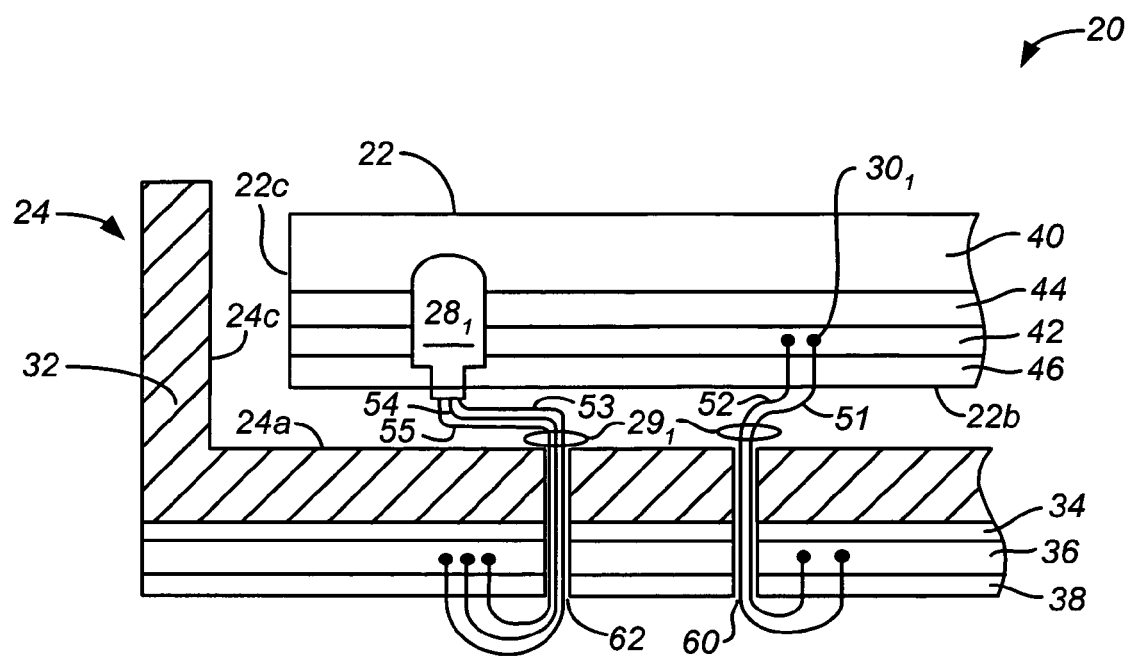
FIG. 3 is an expanded view of portion A of substrate heater 20 shown in FIG. 2 according to an embodiment of the present invention.

Referring now to FIG. 3, which is an enlarged view of portion A shown in FIG. 2, including bake plate 22 and heat shield 24. Heat shield 24 includes a cup-shaped shield 32, which may be made, for example, from stainless steel or any other appropriate material. Shield 32 is spaced apart from and generally surrounds lower surface 22b and side surface 22c of bake plate 22. Shield 32 includes an interior upper surface 24a spaced apart from bake plate lower surface 22b and an interior side surface 24c spaced apart from bake plate side surface 22c. A patterned wiring layer 36 is formed on the lower surface of shield 32. Wiring layer 36 is sandwiched between an upper insulating layer 34 and a lower insulating layer 38. In one embodiment, each insulating layer 34, 38 is a kapton layer and patterned wiring layer 36 includes a plurality of patterned metal traces formed on one of the kapton layers as is understood by a person of ordinary skill in the art. In an alternative embodiment, wiring layers 36 may be a multilayer structure having two or more signal layers separated by an insulating layer. For example, in one embodiment a first layer may be used for AC signals, a second wiring layer for RTD signals, and a third grounding layer with each of the layers being separated by a kapton or other insulting layer appropriate for use in the PCB industry and high temperature applications.

The individual wires in each wire bundle $29_1$ are coupled to wiring layer 36. For example, as shown in FIG. 3, bundle of wires $29_1$ includes two wires 51, 52 that connect heater element $30_1$ to an AC power supply and three wires 53, 54, 55 that connect temperature sensor $28_1$ to an appropriate controller, e.g., a signal processor, that monitors the detected temperature and varies the frequency (duty cycle) at which power is supplied to heater element $30_1$ as appropriate. Each of wires 51-55 passes through a pass-through hole in shield 24 and is coupled to an appropriate signal trace in wiring layer 36. Using, for example, a high temperature solder connection or other appropriate process. In the embodiment shown in FIG. 3, wires 51, 52 extend through through-hole 60 while wires 53, 54, 55 extend through through-hole 62.

Figure 4:
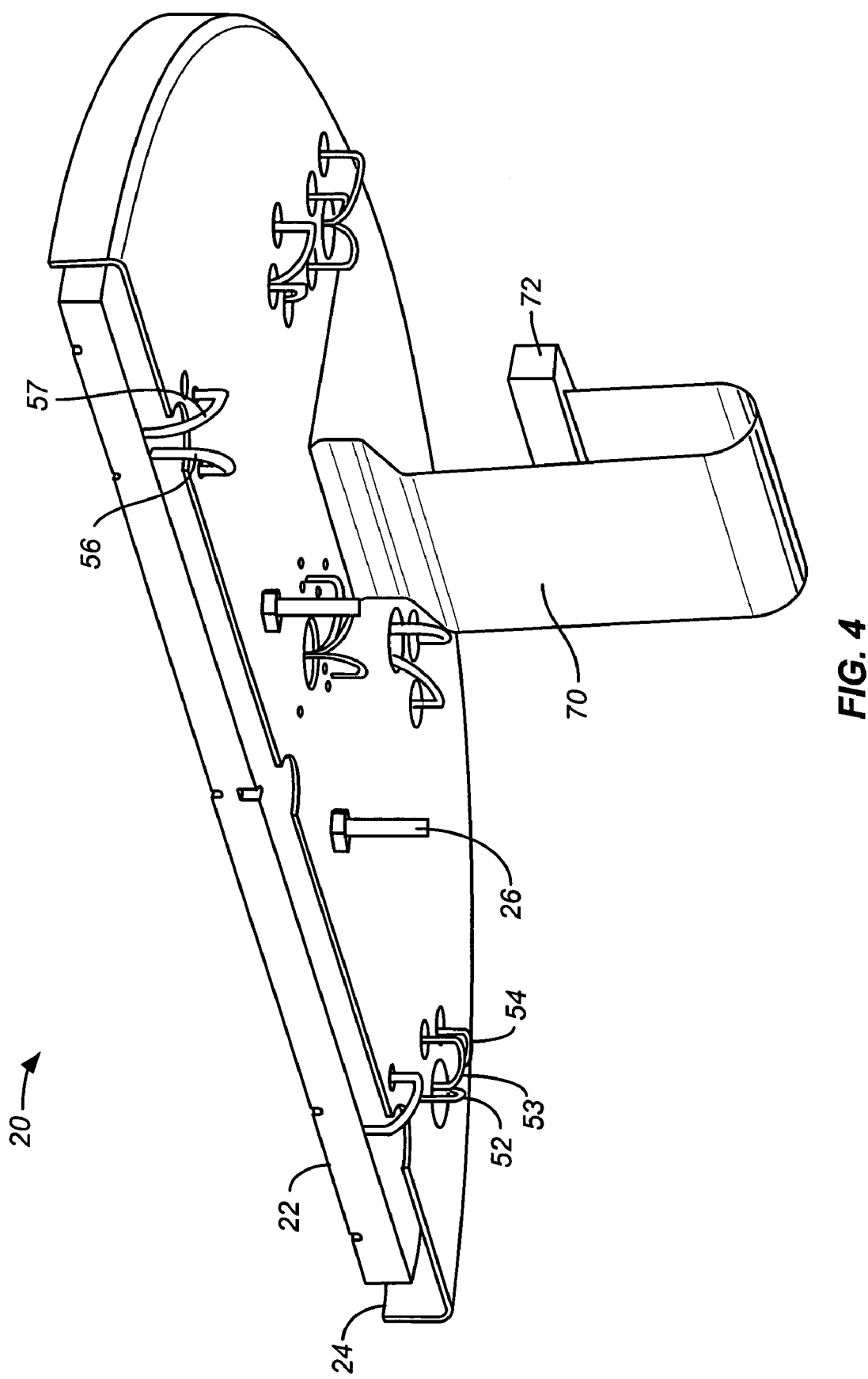
FIG. 4 is a bottom cross-sectional perspective view of substrate heater 20 shown in FIG. 2 according to an embodiment of the present invention.

While not shown in FIG. 3, the signal traces within wiring layer 36 that wires 51-55 are coupled to are electrically isolated from each other. The patterned metal traces in wiring layer 36 route the signals for each of the various wires in wire bundles $29_1$, $29_2$ and $29_i$ to a common area (shown in FIG. 4) where they are electrically coupled, for example by a ribbon cable 70, to an appropriate multi-pin connector 72 as shown in FIG. 4, which is a simplified bottom cross-sectional perspective view of one embodiment of substrate heater 20 according to the present invention. As shown in FIG. 4, wires for AC power (e.g., wires 56, 57) may be thicker than wires for 52, 53, 54 that couple one of the temperature sensors to signal layer 36. In one embodiment, the AC power wires are 26 gauge wires while the sensor signal wires are 30 gauge.

As shown in FIG. 3, bake plate 22 typically includes multiple layers. For example, in one embodiment bake plate 22 includes a continuous upper aluminum plate 40 over a layer 42 of resistive heating elements. Layer 42 includes separate heating elements for each individual heating zone $30_1$ which are sandwiched between insulation layers 44 and 46. Insulation layers 44, 46 can be formed from kapton or other suitable materials. In one particular embodiment plate 40 consists of an aluminum 6061-T6 plate which acts as a low thermal mass for compensating for temperature variations and each heating zone $30_1$ includes a resistive heater laminated and bonded to the aluminum plate using an all polyimide construction that allows operation up to 250° C.

In some embodiments patterned signal layer 36 (along with appropriate insulating layers 34, 38) can be formed on lower surface 22*b* of bake plate 22 instead of on the lower surface of the heat shield as shown in FIGS. 3 and 4. In such embodiments, heat shield 24 is optional. When a sufficiently large number of metal traces are formed on the bottom of bake plate 22, however, routing the metal traces to a concentrated area on the bottom of the bake plate for connection to a ribbon cable or similar mechanism may result in small differences in the thermal characteristics of the region of the bake plate above the concentrated metal traces as compared to regions of the bake plate outside of this region. That is, having a relatively high concentration of metal (even thin metal traces) formed on one portion of the bake plate may result in small differences in the thermal characteristics of that region of the bake plate as compared to other regions that do not have such a high concentration of metal formed on the lower surface. These small differences may in turn adversely impact the temperature uniformity of the bake plate. The inventors have found that forming patterned signal layer 36 on the bottom of the heat shield, which is separated from bake plate 22 by an air gap, as shown in FIGS. 3 and 4 eliminates thermal cross-talk between the metal traces in signal layer 36 and the bake plate. Thus, embodiments of the invention similar to that shown in FIGS. 3 and 4 which minimize or eliminate such non-uniformities by thermally isolating signal layer 36 from bake plate 22 are sometimes preferred.

While the present invention has been described with respect to particular embodiments and specific examples thereof, it should be understood that other embodiments may fall within the spirit and scope of the invention. For example, while one embodiment of the bake plate described above included six independently controllable heating zones, the present invention is applicable to bake plates having more than six heating zones and less than six heating zones. The scope of the invention should, therefore, be determined with reference to the appended claims along with their full scope of equivalents.

What is claimed is:

1. A substrate heater comprising:
    a bake plate having an upper surface, a lower surface and a peripheral side surface extending between the upper and lower surfaces, the bake plate including at least one heating element, at least one temperature sensor and a plurality of wires including at least one wire coupled to the heating element and at least one wire coupled to the temperature sensor;
    a shield spaced apart from and generally surrounding the lower and peripheral side surfaces of the bake plate, the shield having an interior upper surface facing the lower surface of the bake plate, an interior side surface facing the peripheral side surface of the bake plate and a lower surface opposite the interior upper surface;
    a patterned signal layer formed on the lower surface of the shield, wherein the plurality of wires are electrically coupled to a corresponding plurality of signal traces formed in the patterned signal layer; and
    a connector, electrically coupled to the plurality of signal traces in the patterned signal layer, adapted to facilitate electrical connections to the plurality of wires.

2. The substrate heater set forth in claim 1 wherein the patterned signal layer is sandwiched between first and second insulation layers also formed on the lower surface of the shield.

3. The substrate heater set forth in claim 1 further comprising a plurality of support posts that extend from the lower surface of the bake plate through the shield, the plurality of support posts being adapted to create a predetermined distance between the bake plate and shield.

4. The substrate heater set forth in claim 1 further comprising a ribbon cable electrically coupled between the plurality of signal trances and the connector.

5. A substrate heater comprising:
    a bake plate having an upper surface, a lower surface and a peripheral side surface extending between the upper and lower surfaces, the bake plate including a plurality of independently controllable heating zones, each zone including a heating element, a temperature sensor and a plurality of wires including at least one wire coupled to the heating element and at least one wire coupled to the temperature sensor;
    a shield spaced apart from and generally surrounding the lower and peripheral side surfaces of the bake plate, the shield having an interior upper surface facing the lower surface of the bake plate, an interior side surface facing the peripheral side surface of the bake plate and a lower surface opposite the interior upper surface;
    a patterned signal layer formed on the lower surface of the shield, wherein the plurality of wires associated with each independently controllable heating zone are electrically coupled to a corresponding plurality of signal traces formed in the patterned signal layer; and
    a connector, electrically coupled to the plurality of signal traces in the patterned signal layer, adapted to facilitate electrical connections to the plurality of wires.

6. The substrate heater set forth in claim 5 wherein the patterned signal layer is sandwiched between first and second insulation layers also formed on the lower surface of the shield.

7. The substrate heater set forth in claim 5 further comprising a plurality of support posts that extend from the lower surface of the bake plate through the shield, the plurality of support posts being adapted to create a predetermined distance between the bake plate and shield.

8. The substrate heater set forth in claim 7 wherein the plurality of support posts extend from a portion of the bake plate associated within a single, inner most heating zone.

9. The substrate heater set forth in claim 5 further comprising a ribbon cable electrically coupled between the plurality of signal trances and the connector.

* * * * *